United States Patent
Ahn et al.

(10) Patent No.: US 8,466,749 B2
(45) Date of Patent: Jun. 18, 2013

(54) VARIABLE GAIN AMPLIFIER

(75) Inventors: Jungwuk Ahn, Yokohama (JP); Teppei Suda, Yokohama (JP); Tomio Ueda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 4 days.

(21) Appl. No.: 13/215,762

(22) Filed: Aug. 23, 2011

(65) Prior Publication Data

US 2012/0105157 A1 May 3, 2012

(30) Foreign Application Priority Data

Nov. 1, 2010 (JP) ................................. 2010-245378

(51) Int. Cl.
*H03F 1/22* (2006.01)
(52) U.S. Cl.
USPC ......................................................... 330/311
(58) Field of Classification Search
USPC .................................................. 330/51, 311
See application file for complete search history.

(56) References Cited

U.S. PATENT DOCUMENTS

| | | | |
|---|---|---|---|
| 7,352,247 B2 * | 4/2008 | Oh et al. ........................ | 330/311 |
| 2002/0167355 A1 * | 11/2002 | Jones ............................... | 330/51 |
| 2006/0033575 A1 | 2/2006 | Ooya et al. | |
| 2007/0222515 A1 | 9/2007 | Koutani et al. | |

FOREIGN PATENT DOCUMENTS

| JP | 2004-112299 A | 4/2004 |
|---|---|---|
| JP | 2007-259297 A | 10/2007 |

* cited by examiner

*Primary Examiner* — Steven J Mottola
(74) *Attorney, Agent, or Firm* — Arent Fox LLP (57) ABSTRACT

A variable gain amplifier includes a source-grounded transistor, to a gate of which an input signal is supplied; a plurality of first cascode transistors, sources of which are connected to a drain of the source-grounded transistor; a second cascode transistor, a source of which is connected to the drain of the source-grounded transistor; a first gate-grounded transistor, a source of which is connected to drains of the plurality of first cascode transistors, and to a gate of which a constant voltage is applied; and an output load connected to a drain of the first gate-grounded transistor wherein the plurality of first cascode transistors and the second cascode transistor are put into a conducting state or a non-conducting state such that a drain current of the source-grounded transistor is constant and moreover a fraction of the drain current supplied to the plurality of first cascode transistors changes.

12 Claims, 5 Drawing Sheets

VARIABLE GAIN AMPLIFIER

CROSS-REFERENCE TO RELATED APPLICATION

This application is based upon and claims the benefit of priority of the prior Japanese Patent Application No. 2010-245378, filed on Nov. 1, 2010, the entire contents of which are incorporated herein by reference.

FIELD

This embodiments relates to a variable gain amplifier.

BACKGROUND

Transceiver devices are provided with variable gain amplifiers enabling gain adjustment. For example, a variable gain amplifier to amplify high-frequency signals received by an antenna is provided in a portable terminal for mobile communication. This variable gain amplifier amplifies received signals by a large gain when the received signals are weak, and amplifies received signals by a small gain, so that there is no output saturation, when the received signals are strong.

Further, a variable gain amplifier is provided in a portable terminal to amplify high-frequency signals to be transmitted from an antenna. This variable gain amplifier amplifies transmission signals by a large gain when the signals arriving at the base station are weak, and amplifies transmission signals by a small gain when the signals arriving at the base station are strong.

Such a variable gain amplifier has an emitter-grounded transistor which amplifies input signals, and a plurality of parallel cascode transistors (vertically stacked transistors) connected to the emitter-grounded transistor. Further, this variable gain amplifier has an output load connected to a portion of the plurality of cascode transistors, and a gate potential control circuit which performs on/off control of each of the cascode transistors.

By means of this gate potential control circuit, by controlling the fraction of current flowing to the output load among the input signal amplified by the emitter-grounded transistor (hereafter called the amplified signal), the gain (the intensity ratio of the output signal to the input signal) is adjusted. (For example, refer to Japanese Laid-Open Patent Publication No. 2007-259297.)

SUMMARY

According to one aspect of the embodiments, a variable gain amplifier includes a source-grounded transistor, to a gate of which an input signal is supplied; a plurality of first cascode transistors, sources of which are connected to a drain of the source-grounded transistor; a second cascode transistor, a source of which is connected to the drain of the source-grounded transistor; a first gate-grounded transistor, a source of which is connected to drains of the plurality of first cascode transistors, and to a gate of which a constant voltage is applied; and an output load connected to a drain of the first gate-grounded transistor, wherein the plurality of first cascode transistors and the second cascode transistor are put into a conducting state or a non-conducting state such that a drain current of the source-grounded transistor is constant and moreover a fraction of the drain current supplied to the plurality of first cascode transistors changes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As described previously, by controlling the fraction of current flowing to the output load among the input signal amplified by the emitter-grounded transistor (hereafter called the amplified signal), the gain (the intensity ratio of the output signal to the input signal) is adjusted. However, if the fraction of current flowing to the output load in the amplified signal changes, the voltage across the output load changes, and the source-drain voltages of the cascode transistors connected to the output load fluctuate. As a result, the internal resistances of the cascode transistors change, and an error occurs between the actual gain and the desired gain. Thus in a variable gain amplifier, there is the problem that gain errors occur.

Preferred embodiments of the present invention will be explained with reference to accompanying drawings.

(1) Structure

Figure 1:
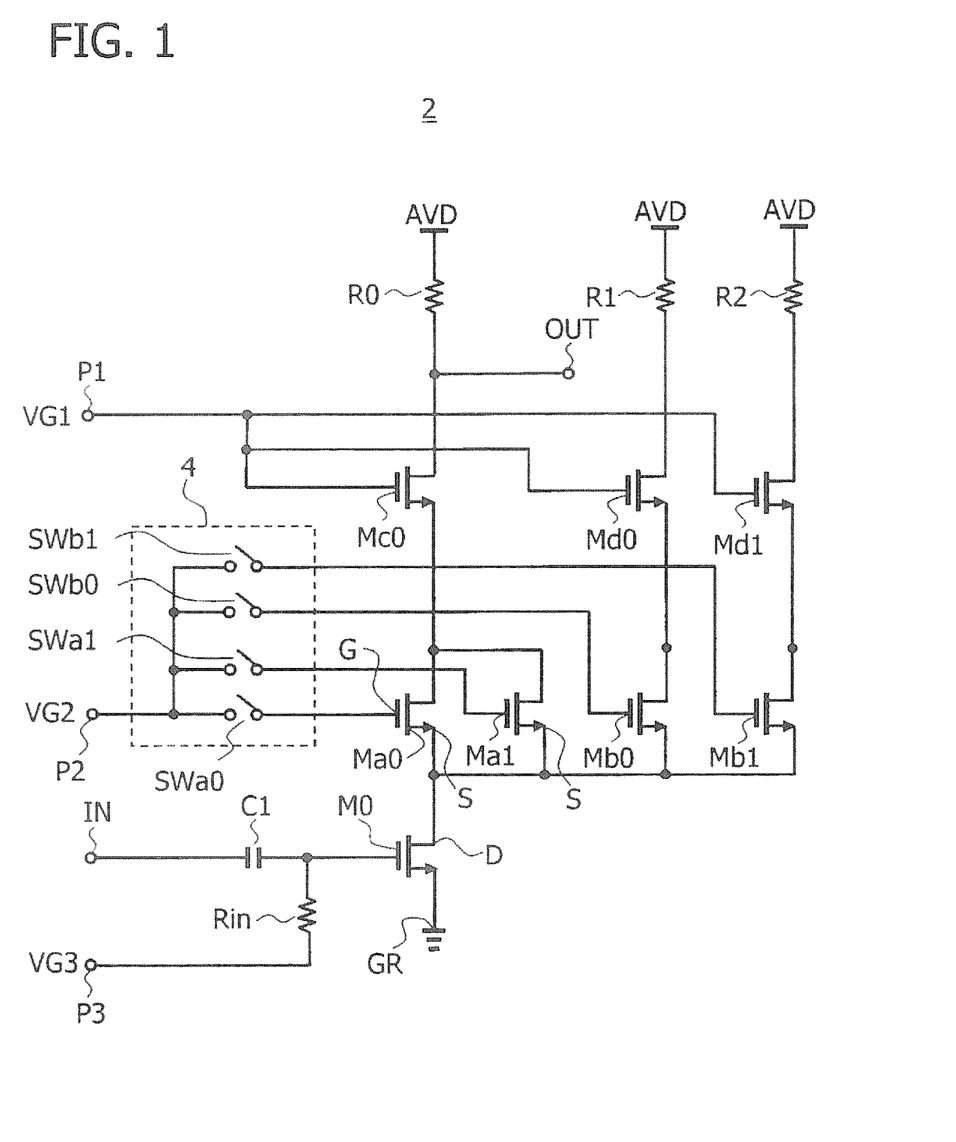
FIG. 1 is a circuit diagram of the variable gain amplifier of an embodiment.

FIG. 1 is a circuit diagram of the variable gain amplifier 2 of an embodiment.

As illustrated in FIG. 1, the variable gain amplifier 2 has a source-grounded transistor M0 to the gate of which input signals are supplied, a plurality of first cascode transistors Ma0, Ma1 (hereafter called first cascade transistors Ma0, Ma1), a second cascode transistor Mb0, a first gate-grounded transistor Mc0, and an output load R0.

Here, the drain D of the source-grounded transistor M0 is connected to the sources S of the plurality of first cascode transistors Ma0, Ma1.

The drain D of the source-grounded transistor M0 is also connected to the source of the second cascode transistor Mb0. The drains of the plurality of first cascode transistors Ma0, Ma1 are connected to the source of the first gate-grounded transistor Mc0. Further, one end of the output load R0 is connected to the drain of the first gate-grounded transistor Mc0. A power supply voltage AVD is supplied to the other end of the output load R0. On the other hand, a ground plane GR is connected to the source of the source-grounded transistor M0, supplying ground potential.

The variable gain amplifier 2 further has a second gate-grounded transistor Md0, a first voltage-compensated load R1, a third cascode transistor Mb1, a third gate-grounded transistor Md1, and a second voltage-compensated load R2.

Here, the drain of the second cascode transistor Mb0 is connected to the source of the second gate-grounded transistor Md0. Further, one end of the first voltage-compensated load R1 is connected to the drain of the second gate-grounded transistor Md0. A power supply voltage AVD is supplied to the other end of the first voltage-compensated load R1.

The drain of the source-grounded transistor M0 is connected to the source of the third cascode transistor Mb1. The drain of the third cascode transistor Mb1 is connected to the source of the third gate-grounded transistor Md1. Further, one end of the second voltage-compensated load R2 is connected to the drain of the third gate-grounded transistor Md1. A power supply voltage AVD is supplied to the other end of the second voltage-compensated load R2.

The gates of the first gate-grounded transistor Mc0, second gate-grounded transistor Md0, and third gate-grounded transistor Md1 are all connected to a first voltage terminal P1. A first constant voltage VG1 is supplied to this first voltage terminal P1. Here, a constant voltage is a potential difference with the ground plane GR, and is a DC voltage having a constant value (and similarly below).

Further, the variable gain amplifier 2 has a cascode transistor control circuit 4 which individually performs on/off control of each of the plurality of first cascode transistors Ma0, Ma1, the second cascode transistor Mb0, and the third cascode transistor Mb1. This cascode transistor control circuit 4 has a first switch element SWa0, second switch element SWa1, third switch element SWb0, and fourth switch element SWb1.

The two ends of the first switch element SWa0 are respectively connected to the gate of one among the plurality of first cascode transistors Ma0, Ma1 (hereafter called the first cascode transistor Ma0), and to a second voltage terminal P2. A constant voltage VG2 is supplied to this second voltage terminal P2. Similarly, the two ends of the second through fourth switch elements SWa1, SWb0, SWb1 are respectively connected to the gates of the corresponding cascode transistors and the second voltage terminal P2.

Further, the variable gain amplifier 2 has a coupling capacitor C1 and a bias resistor Rin. The two ends of the coupling capacitor C1 are respectively connected to the gate of the source-grounded transistor M0 and to an input terminal IN. The two ends of the bias resistor Rin are respectively connected to the gate of the source-grounded transistor M0 and to a third voltage terminal P3. Here, an input signal is supplied to the input terminal IN. A third constant voltage VG3 is supplied to the third voltage terminal P3.

Each of the above-described transistors (source-grounded transistor M0 and similar) is for example a MOSFET (metal oxide semiconductor field effect transistor). It is preferable that these transistors be formed on the same silicon substrate, and have gate oxide films with substantially the same thickness and substantially the same channel lengths. However, the channel widths of the transistors are not always constant, as explained below. When the above transistors are n-type MOSFETs, AVD>VG1>VG2>VG3. On the other hand, when the above transistors are p-type MOSFETs, AVD<VG1<VG2<VG3.

The first through fourth switch elements SWa0, SWa1, SWb0, SWb1 are for example MOS transfer gates. Further, the loads (output load R0, first voltage-compensated load R1, and second voltage-compensated load R2) are for example resistor elements.

(2) Operation

Figure 2:
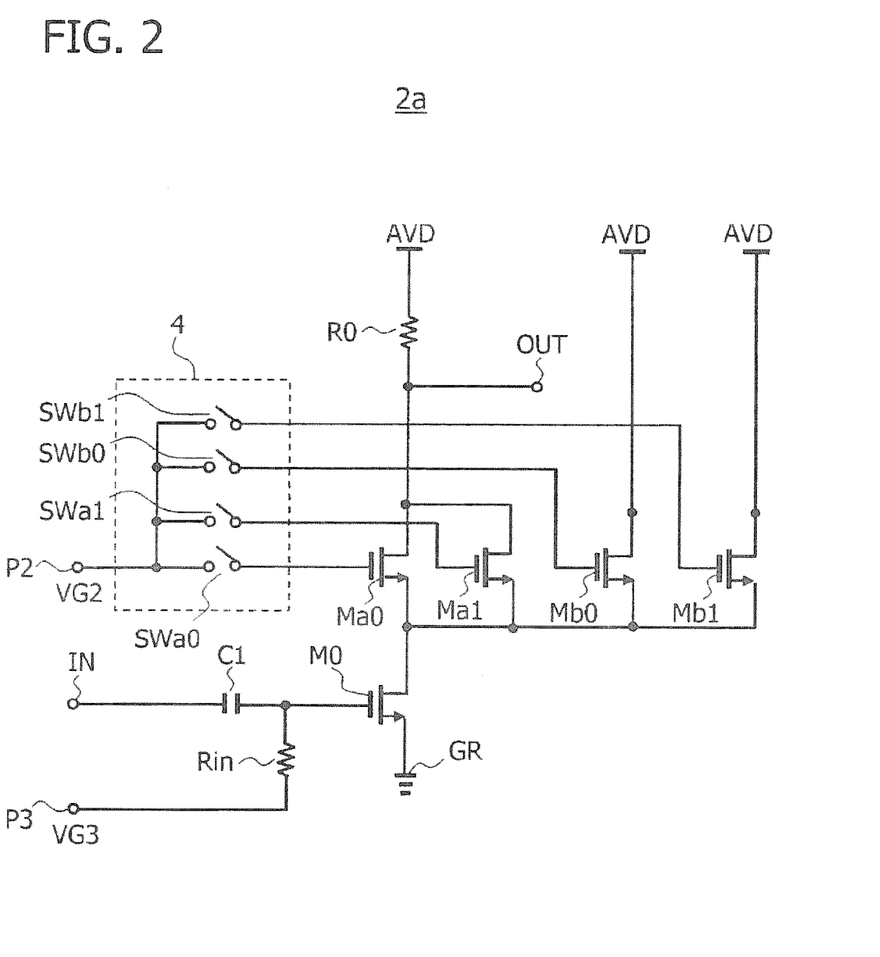
FIG. 2 is a circuit diagram illustrating an example of a variable gain amplifier.

FIG. 2 is a circuit diagram illustrating an example of a variable gain amplifier 2a. This variable gain amplifier 2a has substantially the same structure as the variable gain amplifier 2 of this embodiment. However, the variable gain amplifier 2a does not include the first through third gate-grounded transistors Mc0, Md0, Md1 or the first and second voltage-compensated loads R1, R2.

Variable gain operation of the variable gain amplifier 2 of this embodiment is substantially the same as that of the variable gain amplifier 2a. Hence the variable gain operation of the variable gain amplifier 2a is first explained, and at the same time problems thereof are explained.

Each of the transistors of the variable gain amplifier 2a is biased, by the second and third constant voltage VG2, VG3 and the power supply voltage AVD applied to the gates, so as to operate in a saturation state. In this state, a minute input signal is applied to the input terminal IN, and the input signal is applied to the gate of the source-grounded transistor M0 via the coupling capacitor C1. By this means, a signal component occurs in the drain current of the source-grounded transistor M0, and this signal component is supplied to the first through third cascode transistors Ma0, Ma1, Mb0, Mb1. The behavior of this signal component may be explained using a small-signal equivalent circuit.

Figure 3:
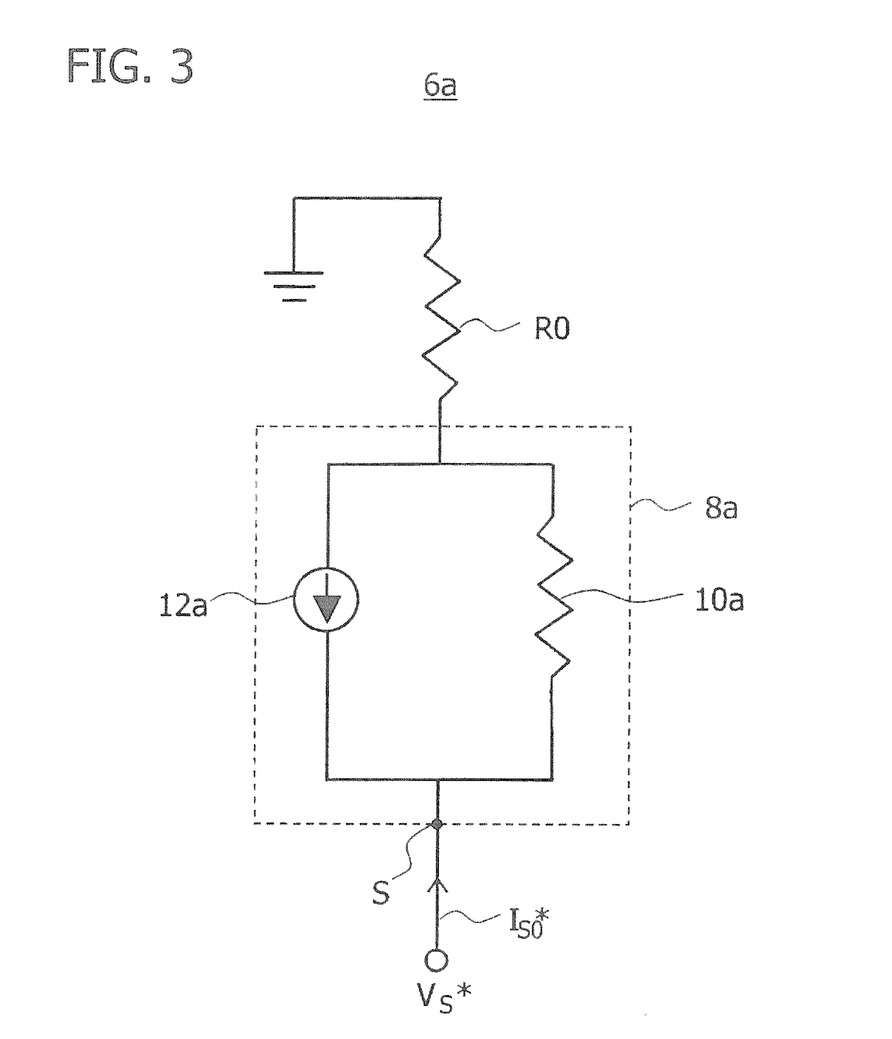
FIG. 3 is small-signal equivalent circuits corresponding to the plurality of first cascode transistors and the output load (part 1)
Figure 4:
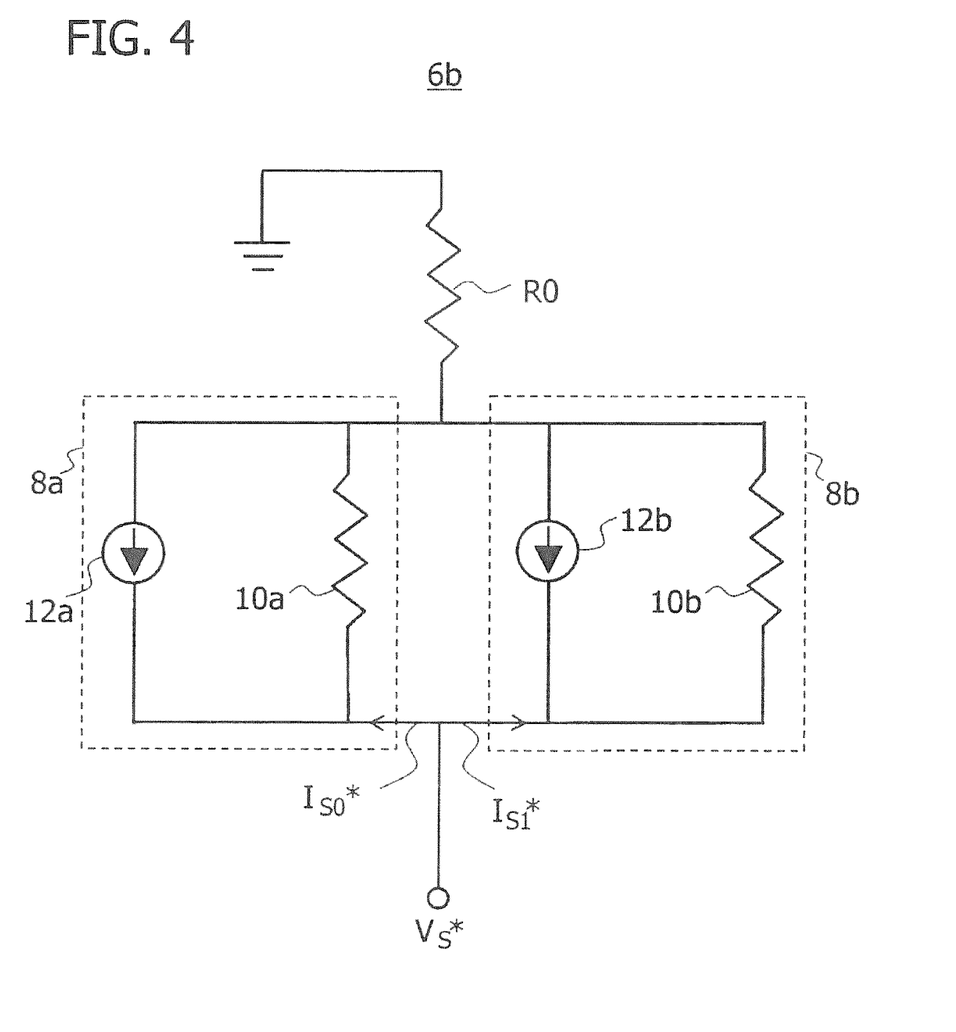
FIG. 4 is small-signal equivalent circuits corresponding to the plurality of first cascode transistors and the output load (part 2)

FIG. 3 and FIG. 4 are small-signal equivalent circuits corresponding to the plurality of first cascode transistors Ma0, Ma1 and the output load R0. FIG. 3 is a small-signal equivalent circuit 6a for the case in which one of the first cascode transistors Ma0 is in the conducting state (the on state), and the other first cascode transistor Ma1 is in the non-conducting state (the off state) (hereafter called state a). FIG. 4 is a small-signal equivalent circuit 6b for the case in which the plurality of first cascode transistors Ma0, Ma1 are both in the conducting state (hereafter called state b).

In the small-signal equivalent circuit 6a of FIG. 3 corresponding to state a, the output load R0 is series-connected to the small-signal equivalent circuit 8a for the first cascode transistor Ma0. The small-signal equivalent circuit 8a for the first cascode transistor Ma0 has a parallel-connected small-signal current supply 12a and internal resistance 10a. One end of the output load R0 (the terminal on the side of the power supply voltage AVD) is AC-grounded, as illustrated in FIG. 3.

Here, the magnitude of the output current of the small-signal current supply 12a is $gm_0 \times (Vg^* - Vs^*)$. $gm_0$ is the transconductance of the first cascode transistor Ma0. $Vg^*$ and $Vs^*$ are respectively the gate potential and source potential of the first cascode transistor Ma0. A variable with the superscript "*" (for example $Vg^*$) is the small-signal component of the corresponding electrical quantity (for example, the gate potential Vg).

Upon analyzing the circuit equations corresponding to the circuit of FIG. 3, the following equation is obtained.

[E 1]

$$V_s^* = \frac{\left(1 + \frac{R0}{r0}\right) \cdot I_{s0}^* + gm_0 \cdot r0 \cdot V_g^*}{gm_0 + \frac{1}{r0}} \quad (1)$$

Here $I_{s0}^*$ is the source current of the first cascode transistor Ma0. R0 is the resistance value of the output load R0. r0 is the resistance value of the internal resistance 10a.

The constant voltage VG2 is applied to the gate of the first cascode transistor Ma0, in the conducting state. Hence $Vg^*=0$. Substituting this equation into equation (1), the following equation is obtained.

[E 2]

$$\frac{V_s^*}{I_{s0}^*} = \frac{1 + \frac{R0}{r0}}{gm_0 + \frac{1}{r0}} \quad (2)$$

Equation (2) includes the output load R0, but the resistance value of the output load R0 is normally approximately 50Ω. On the other hand, the transistor internal resistance r0 is normally several kΩ (for example, 3.5 kΩ). That is, r0>>R0. Hence equation (2) may be approximated as follows.

[E 3]

$$\frac{V_s^*}{I_{s0}^*} \cong \frac{1}{gm_0 + \frac{1}{r0}} \quad (3)$$

Hence the small-signal equivalent circuit 6a corresponding to the state a in which only the first cascade transistor Ma0 is conducting is equivalent to a resistance element having the resistance value represented by the right-hand side of equation (3).

In the small-signal equivalent circuit 6b of FIG. 4, corresponding to the state b in which both the first cascade transistors Ma0, Ma1 are conducting, the small-signal equivalent circuits 8a, 8b corresponding respectively to the first cascade transistors Ma0, Ma1 are connected in parallel, and this parallel circuit is series-connected to the output load R0.

Upon analyzing the circuit equations corresponding to the circuit of FIG. 4, the following equation is obtained.

[E 4]

$$\frac{V_s^*}{I_{s0}^* + I_{s1}^*} \cong \frac{1}{\frac{1}{gm_0 + \frac{1}{r0}} + \frac{1}{gm_1 + \frac{1}{r1}}} \quad (4)$$

Here, $I_{s0}^*$ is the source current of one first cascade transistor Ma0. $I_{s1}^*$ is the source current of the other first cascade transistor Ma1. gm1 is the transconductance of the other first cascade transistor Ma1. r1 is the internal resistance value of the other first cascade transistor Ma1.

Hence the small-signal equivalent circuit 6b corresponding to the state b in which both first cascade transistors Ma0, Ma1 are conducting is equivalent to two resistance elements connected in parallel. The first term in the denominator of equation (4) is the resistance value of the resistance element corresponding to one first cascade transistor Ma0. The second term in the denominator of equation (4) is the resistance value of the resistance element corresponding to the other first cascade transistor Ma1.

Further, as is clear from the above explanation, the small-signal equivalent circuit of the second cascade transistor Mb0 in the conducting state is also equivalent to a resistance element. The resistance value of this resistance element is the value obtained by substituting the transconductance and internal resistance value for the second cascade transistor Mb0 for $gm_0$ and r0 in the right side of equation (3). The same is true for the third cascade transistor Mb1.

As is clear from the above explanation, the circuit between the cascode transistors in the conducting state Ma0, Ma1, Mb0, Mb1 and the power supply voltage AVD is equivalent to a resistance element (hereafter called an equivalent resistance element). Hence the small-signal equivalent circuit for a general variable gain amplifier 2a is a simple circuit.

Figure 5:
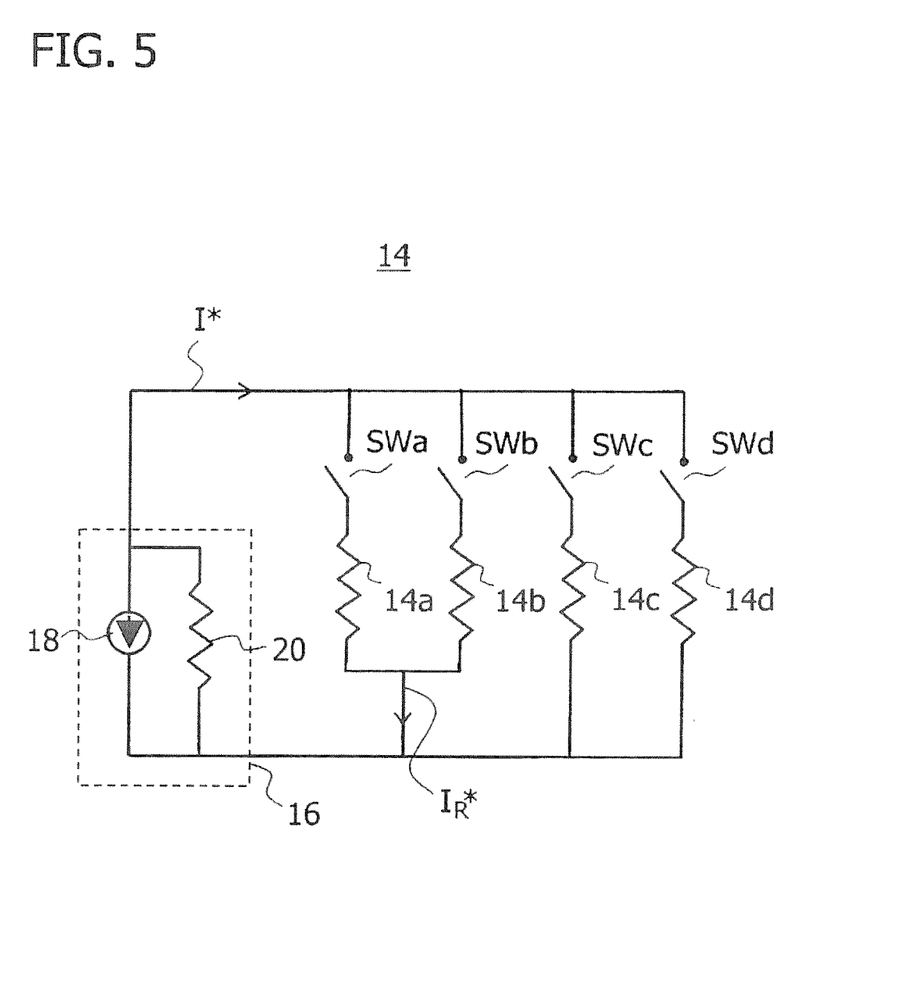
FIG. 5 is a small-signal equivalent circuit for the general variable gain amplifier.

FIG. 5 is a small-signal equivalent circuit 14 for the general variable gain amplifier 2a. This small-signal equivalent circuit 14 has a small-signal equivalent circuit 16 corresponding to the source-grounded transistor M0, and equivalent resistance elements 14a, 14b, 14c, 14d corresponding to the first through third cascode transistors Ma0, Ma1, Mb0, Mb1 in the conducting state. The small-signal equivalent circuit 14 further has switch elements SWa, SWb, SWc, SWd, series-connected to these equivalent resistance elements 14a, 14b, 14c, 14d respectively, which open and close according to the conducting/non-conducting states of the corresponding cascode transistors.

Here, one end of the equivalent resistance elements 14a, 14b corresponding to the first cascode transistors Ma0, Ma1 are connected together, as illustrated in FIG. 5. By this means, the currents flowing in the equivalent resistance elements 14a, 14b are combined to become the load current $I_R^*$. This load current $I_R^*$ is supplied to the output load R0 (see FIG. 2), and a small-signal voltage occurs across the output load R0. This small-signal voltage is output from the output terminal OUT, and becomes the output signal. The output load R0 is ignored when deriving the approximating equation (3), and so does not exist in the small-signal equivalent circuit 14.

The small-signal equivalent circuit 16 corresponding to the source-grounded transistor M0 has a parallel-connected small-signal current supply 18 and internal resistance 20, as illustrated in FIG. 5. Here, the current value of the small-signal current supply 18 is the value obtained by multiplying the voltage Vin* of the input signal supplied to the input terminal IN by the transconductance gm thereof (=gm·Vin*).

The resistance values of the equivalent resistance elements 14a, 14b, 14c, 14d are values obtained based on equation (3). For example, by substituting the transconductance and internal resistance value of the second cascode transistor Mb0 for $gm_0$ and r0 in the right-hand side of equation (3), the resistance value of the equivalent resistance element 14c corresponding to the second cascode transistor Mb0 is obtained.

The switch elements SWa, SWb, SWc, SWd open and close in response to the opening and closing of the switch elements SWa0, SWa1, SWb0, SWb1 corresponding to the cascode transistor control circuit 4 (not illustrated).

Here, it is preferable that the first through third cascode transistors Ma0, Ma1, Mb0, Mb1 be formed on the same substrate, and have gate oxide films of substantially the same thickness and channels of substantially the same length. In this case, the respective transconductances of the first through third cascode transistors are proportional to the channel widths W of the respective cascode transistors. Further, the respective internal resistance values of the first through third cascode transistors are inversely proportional to the channel widths W of the respective cascode transistors. Hence the respective conductances (reciprocals of resistance values) of the equivalent resistance elements 14a, 14b, 14c, 14d in FIG. 5 are proportional to the channel widths W of the respective cascode transistors, as is clear from equation (3).

Next, this small-signal equivalent circuit 14 is used to explain the variable gain operation of the general variable gain amplifier 2a. Here, suppose that the ratios of channel widths for the first through third cascode transistors Ma0, Ma1, Mb0, Mb1 are 1:1:2:3. In this case, the ratios of the conductances (the reciprocals of the resistance values) of the equivalent resistance elements 14a, 14b, 14c, 14d are 1:1:2:3. The case when only the switch element SWa, switch element SWb and switch element SWc are closed (hereafter called state A), and the case when only the switch element SWa and the switch element SWd are closed (hereafter called state B) are compared. States A and B respectively correspond to states a and b of the small-signal equivalent circuit 14.

In the case of state A, the sum of the conductances of the equivalent resistance elements 14a, 14b, 14c connected to the closed switch elements SWa, SWb, SWc is four times (=1+1+2) the conductance of the equivalent resistance element 14a. In the case of state B, the sum of the conductances of the equivalent resistance elements 14a, 14d connected to the closed switch elements SWa, SWd is four times (=1+3) the conductance of the equivalent resistance element 14a. Hence in both the cases of state A and state B, the sum of the conductances of the equivalent resistance elements parallel-connected to the small-signal equivalent circuit 16 (corresponding to the source-grounded transistor M0) is unchanged. Hence the output current I* of the small-signal equivalent circuit 16 in state A and the output current I* in state B are the same. The output current I* of the small-signal equivalent circuit 16 is the signal component (AC component) included in the drain current of the source-grounded transistor M0.

In state A, current flows in the two equivalent resistance elements 14a, 14b corresponding to the first cascode transistors Ma0, Ma1. Here, the ratio of the conductances of the equivalent resistance element 14a and the equivalent resistance element 14b is 1:1. Hence the load current $I_R^*$ is two times (=1+1) the current flowing in the equivalent resistance element 14a. On the other hand, in state B the switch SWb corresponding to the equivalent resistance element 14b is open, so that no current flows in the equivalent resistance element 14b. Hence the load current $I_R^*$ is one time (=1) the current flowing in the equivalent resistance element 14a.

Hence the ratio of the magnitudes of the load currents $I_R^*$ for state A and state B is 2:1. As explained above, the output signal is the voltage appearing across the load resistance R0 due to the load current $I_R^*$. Hence the ratio of the magnitudes of the output signals for state A and for state B is 2:1. That is, the gain (ratio of the output signal magnitude to the input signal magnitude) for state A is higher by 6 dB (=20×log 2) than the gain for state B. Through this operation, variable gain is realized in the general variable gain amplifier 2a. In the variable gain amplifier 2 of this embodiment also, variable gain is realized by similar operation.

In the above operation, the current supplied to the output load R0 among output current I* of the source-grounded transistor M0 changes, and variable gain operation is realized. Here the output current I* is controlled by opening and closing the switches SWa0, SWa1, SWb0, SWb1 of the cascode transistor control circuit 4.

When any one of the switch elements SWa0, SWa1, SWb0, SWb1 is closed, the constant voltage VG2 is applied to the gate of the connected cascode transistor. By this means, the connected cascode transistor enters the conducting state. On the other hand, when any one of the switch elements SWa0, SWa1, SWb0, SWb1 is opened, the gate of the connected cascode transistor is opened, and the connected cascode transistor enters the non-conducting state.

The switch elements SWa0, SWa1, SWb0, SWb1 are opened and closed such that the drain current of the source-grounded transistor M0 is constant and moreover the fraction of current supplied to the plurality of first cascode transistors Ma0, Ma1 in the above drain current changes. Hence the output current I* (small-signal output current) of the source-grounded transistor M0 is constant, and moreover the fraction of current supplied to the plurality of first cascode transistors Ma0, Ma1 in the above output current I* changes. By this means, the above output current I* supplied to the output load R0 changes, and variable gain operation is realized.

In addition to the load current $I_R^*$ which is a small-signal component, the DC components of the drain currents of the first cascode transistors Ma0, Ma1 are also supplied to the output load R0. Hence a DC voltage appears across the output load R0, and the drain potentials of the first cascode transistors Ma0, Ma1 fall (that is, there is a voltage drop). On the other hand, the source potentials of the first cascode transistors Ma0, Ma1 are substantially fixed at a potential lower than the constant potential VG2 applied to the gates by the threshold values Vth of the transistors (=VG2−Vth). Hence the source-drain voltages of the first cascode transistors Ma0, Ma1 are lowered due to the voltage drop of the output load.

As is well known, the internal resistance value of a transistor is small when the source-drain voltage is low. Hence as explained above, when the source-drain voltages of the first cascode transistors Ma0, Ma1 decline, the conductances of the equivalent resistance elements 14a, 14b corresponding to the first cascode transistors Ma0, Ma1 rise (see equation (3)).

On the other hand, the second and third cascade transistors Mb0, Mb1 are directly connected to the power supply voltage AVD, and so the drain potentials thereof are fixed at the power supply voltage AVD. Hence the internal resistance values of the second and third cascode transistors Mb0, Mb1 are constant, and the conductances of the equivalent resistance elements 14c, 14d corresponding to these transistors change hardly at all.

As explained above, only the resistance values of a portion of the equivalent resistance elements decline, so that the fraction of current flowing to the equivalent resistance elements in the output current I* of the source-grounded transistor M0 changes. Hence an error occurs in the gain of the general variable gain amplifier 2a. Such a gain error is hereafter called a static gain error.

Further, in the general variable gain amplifier 2a, a gain error occurs even when the gain is changed. When the conducting states of the first cascode transistors Ma0, Ma1 are changed in order to change the gain, the DC current flowing in the output load R0 changes. Hence the internal resistance value of the first cascode transistor Ma0 changes, and the gain becomes a value different from the design value based on the small-signal equivalent circuit of FIG. 5. That is, a gain error occurs. Such a gain error is hereafter called a dynamic gain error.

—Suppression of Dynamic Gain Errors—

Hence in the variable gain amplifier 2 of this embodiment, a first gate-grounded transistor Mc0 is provided between the first cascode transistors Ma0, Ma1 and the power supply voltage AVD, as illustrated in FIG. 1. By this means, fluctuation of the drain potentials of the first cascode transistors Ma0, Ma1 is suppressed.

The source potential of the first gate-grounded transistor Mc0 is substantially fixed at a potential lower by the threshold voltage Vth (of the first gate-grounded transistor Mc0) than the first constant voltage VG1 applied to the gate thereof (=VG1−Vth). The drain potentials of the first cascode transistors Ma0, Ma1 are the same as the source potential of the first gate-grounded transistor Mc0, as is clear from the circuit diagram of FIG. 1. Hence the drain potentials of the first cascode transistors Ma0, Ma1 are fixed at substantially constant values (=VG1−Vth). Further, the source potentials of the first cascode transistors Ma0, Ma1 are fixed at substantially constant values by the constant voltage VG2 applied to the gates. Hence the source-drain voltages of the first cascode transistors Ma0, Ma1 are substantially constant. Therefore even when the current flowing in the output load RD changes, there is almost no change in the internal resistance values of the first cascode transistors Ma0, Ma1. Hence dynamic gain errors are suppressed.

—Suppression of Static Gain Errors—

In this embodiment, as illustrated in FIG. 1, a second gate-grounded transistor Md0 is provided between the second cascode transistor Mb0 and the power supply voltage AVD. By this means, the drain potential of the second cascode transistor Mb0 assumes a value lower by the threshold value of the second gate-grounded transistor Md0 than the first constant voltage VG1 applied to the gate of the second gate-grounded transistor Md0.

As explained above, the drain potentials of the first cascode transistors Ma0, Ma1 are lower by the threshold value of the first gate-grounded transistor Mc0 than the first constant voltage VG1. Here the threshold value of MOS transistors is substantially constant.

Hence the drain potentials of the first cascode transistors Ma0, Ma1 and the drain potential of the second cascode transistor Mb0 are substantially equal. Further, the source potentials of the first cascode transistors Ma0, Ma1 and the source potential of the second cascode transistor Mb0 are fixed at values which are substantially equal by applying the constant voltage VG2 to the respective gates. Hence the source-drain voltages of the first cascode transistors Ma0, Ma1 and the source-drain voltage of the second cascode transistor Mb0 are substantially equal, and static gain errors are suppressed.

Similarly, by providing a third gate-grounded transistor Md1, static gain errors due to the third cascode transistor Mb1 are suppressed. The first through third gate-grounded transistors Mc0, Md0, Md1 are biased to a saturation state, similarly to the other transistors.

—Suppression of Residual Gain Errors—

As explained above, the source potentials of transistors to the gates of which a constant voltage is applied are substantially fixed at a value lower by the threshold value thereof than the gate potential. However, when the drain potential changes, the source potential also changes, albeit slightly. Hence when the second gate-grounded transistor Md0 is directly connected to the power supply voltage AVD, a slight difference occurs in the source potentials of the first gate-grounded transistor Mc0 and the second gate-grounded transistor Md0, resulting in gain error. That is, even when the second and third gate-grounded transistors Md0, Md1 are provided, a slight static gain error remains.

Hence as illustrated in FIG. 1, in this embodiment a first voltage-compensated load R1 is provided between the second gate-grounded transistor Md0 and the power supply voltage AVD, and by this means such residual gain errors are suppressed. When the first voltage-compensated load R1 is provided, due to the voltage drop thereof, the drain potential of the second gate-grounded transistor Md0 approaches the drain potential of the first gate-grounded transistor Mc0. By this means, the difference in the source potentials of the first gate-grounded transistor Mc0 and the second gate-grounded transistor Md0 is reduced, and residual gain errors are suppressed.

Further, a second voltage-compensated load R2 is also provided between the third gate-grounded transistor Md1 and the power supply voltage AVD in the variable gain amplifier 2. By this means, residual gain errors due to the third gate-grounded transistor Md1 are suppressed.

In this embodiment, the channel width of the third gate-grounded transistor Md1 is wider than the channel width of the second gate-grounded transistor Md0. Hence more current flows into the second voltage-compensated load R2 than flows into the first voltage-compensated load R1. Hence when the resistance values of the first voltage-compensated load R1 and the second voltage-compensated load R2 are the same, the drain potential of the second gate-grounded transistor Md0 and the drain potential of the third gate-grounded transistor Md1 are not equal. Consequently suppression of residual gain errors is insufficient.

Hence in the variable gain amplifier 2, the resistance value of the first voltage-compensated load R1 and the resistance value of the second voltage-compensated load R2 are inversely proportional to the channel width of the second gate-grounded transistor Md0 and the channel width of the third gate-grounded transistor Md1 (see Table 3 below). By this means, the voltage drops across the first voltage-compensated load R1 and second voltage-compensated load R2 are the same, and so the residual gain error is sufficiently suppressed.

The residual gain error may also be suppressed simply by making the resistance value of the second voltage-compensated load R2 smaller than the resistance value of the first voltage-compensated load R1.

In order to confirm the above operation, the variable gain amplifier 2 illustrated in FIG. 1 was analyzed using a circuit simulator. First the parameter values (channel length and similar) of each of the transistors were appropriately determined, and then simulations were performed in both states A and B. Here state A is the state in which the constant voltage VG2 is applied to the gates of both the first cascode transistors Ma0, Ma1 and the second cascode transistor Mb0, so that these transistors are conducting. State B is the state in which the constant voltage VG2 is applied to the gates of one of the first cascode transistors Ma0 and the third cascode transistor Mb1, so that these transistors are conducting.

TABLE 1

| | Parameter values for state A | | | | | | | |
|---|---|---|---|---|---|---|---|---|
| | M0 | Ma0 | Ma1 | Mb0 | Mb1 | Mc0 | Md1 | Md2 |
| Transconductance (mS) | 128.93 | 24.73 | 24.73 | 49.47 | −0.02 | 45.76 | 45.77 | 0.14 |
| Internal resistance (kΩ) | 0.147 | 3.460 | 3.460 | 1.730 | 39.000 | 0.769 | 0.769 | 346.020 |

TABLE 2

Parameter values for state B

|  | M0 | Ma0 | Ma1 | Mb0 | Mb1 | Mc0 | Md1 | Md2 |
|---|---|---|---|---|---|---|---|---|
| Transconductance (mS) | 128.94 | 24.84 | 0.00 | −0.01 | 74.14 | 31.66 | −0.09 | 68.61 |
| Internal resistance (kΩ) | 0.161 | 3.500 | 478.400 | 58.000 | 1.160 | 1.420 | 518.100 | 0.515 |

TABLE 3

Load resistance values

|  | R0 | R1 | R2 |
|---|---|---|---|
| Resistance value (Ω) | 50 | 50 | 33.333 |

Table 1 presents the transconductances and internal resistance values of each of the transistors, obtained by simulation of state A. Table 2 presents the transconductances and internal resistance values of each of the transistors, obtained by simulation of state B. Table 3 presents the resistance values of the output load RU and similar used in the simulations.

As indicated in Tables 1 and 2, the transconductance of transistors in the conducting state is proportional to the gate width thereof, and the internal resistance value is inversely proportional to the gate width. On the other hand, the transconductance of a transistor in the non-conducting state is substantially zero. The internal resistance value of a transistor in the non-conducting state is two orders of magnitude or more higher than the internal resistance value in the on state.

As indicated in Tables 1 and 2, the internal resistance value of the first cascode transistor Ma0 changes hardly at all even when the operating state changes from state A to state B. And, the gain in state A according to simulations is 6.0 dB higher than the gain in state B. This gain difference coincides with the design value based on the small-signal equivalent circuit 14. That is, by means of the variable gain amplifier 2 of this embodiment, almost no gain error occurs.

On the other hand, upon simulating the general variable gain amplifier 2a illustrated in FIG. 2, the internal resistance value of the first cascode transistor Ma0 in state A was 3.30 kΩ, and the internal resistance value of the first cascode transistor Ma0 in state B was 2.98 kΩ. And the gain in state A was 5.7 dB higher than the gain in state B. That is, a gain error of approximately 0.3 dB occurred in the general variable gain amplifier 2a.

In this way, the general variable gain amplifier 2a generates a gain error. However, by means of the variable gain amplifier 2 of this embodiment, such gain errors may be suppressed.

As explained above, in this embodiment gain errors are suppressed by providing the first gate-grounded transistor Mc0, the second gate-grounded transistor Md0, the third gate-grounded transistor Md1, the first voltage-compensated load R1, and the second voltage-compensated load R2. However, the first voltage-compensated load R1 and the second voltage-compensated load R2 may be omitted. Even if these loads are omitted, static gain errors and dynamic gain errors are suppressed, and so gain errors are small.

Further, the second gate-grounded transistor Md0 and the third gate-grounded transistor Md1 may be omitted. Even if these transistors are omitted, dynamic gain errors are suppressed, and so gain errors are small.

Next, operation of the variable gain amplifier 2 is explained according to the flow of current sent from each transistor.

First, an input signal is supplied to the gate of the source-grounded transistor M0. Next, a portion of or the entirety of the first drain current of the source-grounded transistor M0 is supplied to the sources of the plurality of first cascode transistors Ma0, Ma1. And, a portion of or the entirety of the first drain current excluding the portion supplied to the plurality of first cascode transistors Ma0, Ma1 is supplied to the source of the second cascode transistor Mb0. Further, the first drain current excluding the portion supplied to the first cascode transistors Ma0, Ma1 and the second cascode transistor Mb0 is supplied to the source of the third cascode transistor Mb1.

Next, the second drain current of the plurality of first cascode transistors Ma0, Ma1 is supplied to the source of the first gate-grounded transistor Mc0, to the gate of which the constant voltage VG1 is supplied. Thereafter, the third drain current of the first gate-grounded transistor Mc0 is supplied to the output load R0, and an output signal appears across the output load R0.

On the other hand, the fourth drain current of the second cascode transistor Mb0 is supplied to the source of the second gate-grounded transistor Md0, to the gate of which the constant voltage VG1 is supplied. Next, the fifth drain current of the second gate-grounded transistor Md0 is supplied to the first voltage-compensated load R1, and thereafter is absorbed by the power supply voltage AVD.

Similarly, the sixth drain current of the third cascode transistor Mb1 is supplied to the source of the third gate-grounded transistor Md1, to the gate of which the constant voltage VG1 is supplied. Next, the seventh drain current of the third gate-grounded transistor Md1 is supplied to the second voltage-compensated load R2, and thereafter is absorbed by the power supply voltage AVD.

Here, the plurality of first cascode transistors Ma0, Ma1, the second cascode transistor Mb0, and the third cascode transistor Mb1 are put into the conducting state by the cascode transistor control circuit 4 by supplying the constant voltage VG2 to the gates thereof. At this time, each of the cascode transistors is put into the conducting state or the non-conducting state so that the first drain current of the source-grounded transistor M0 is constant. Further, each of the cascode transistors is put into the conducting state or the non-conducting state such that the fraction of the first drain current supplied to the plurality of first cascode transistors Ma0, Ma1 (that is, the fraction of current supplied to the plurality of the first cascode transistors Ma0, Ma1 in the first drain current of the source-gated transistor) changes. By this means, the gain of the variable gain amplifier 2 is controlled.

And, by means of the first through third gate-grounded transistors and the first and second voltage-compensated loads, the drain-source voltages of the first through third cascode transistors Ma0, Ma1, Mb0, Mb1 are held at substantially the same values, and gain errors are suppressed.

The variable gain amplifier 2 has a third cascode transistor Mb1 in addition to the second cascode transistor Mb0, as illustrated in FIG. 1. However, the third cascode transistor Mb1 may be omitted.

For example, in a circuit in which the third cascade transistor Mb1 is omitted, and the channel widths of the first cascade transistors Ma0, Ma1 and the second cascade transistor Mb0 are made substantially the same. First, both the first cascade transistors Ma0, Ma1 are put into the conducting state, and the second cascade transistor Mb0 is put into the non-conducting state. Next, one of the first cascade transistor Ma0 and the second cascade transistor Mb0 are put into the conducting state, and the other first cascade transistor Ma1 is put into the non-conducting state. Then, the current flowing in the output load R0 in the initial state is twice the current flowing in the output load R0 in the later state. Hence variable gain operation with a gain difference of 6 dB is realized.

In the above example, the plurality of first cascade transistors Ma0, Ma1 and the second cascade transistor Mb0 are put into the conducting state or non-conducting state such that the drain current of the source-grounded transistor M0 is constant. Further, the plurality of first cascade transistors Ma0, Ma1 and the second cascade transistor Mb0 are put into the conducting state or non-conducting state such that the fraction of the above drain current supplied to the plurality of first cascade transistors Ma0, Ma1 (that is, the fraction of current supplied to the plurality of first cascade transistors Ma0, Ma1 in the above drain current) changes.

In the above example, as illustrated in FIG. 1, the second cascade transistor Mb0 is singular. However, a plurality of the second cascade transistors Mb0 may be provided. Similarly, the plurality of third cascade transistors Mb1 may be provided. Also, the number of first cascade transistors may be three or greater.

Further, in the above examples the output load R0, the first voltage-compensated load R1, and the second voltage-compensated load R2 are resistance elements. However, these loads are not limited to resistance elements. These loads may far example be diode-connected transistors with the drain connected to the gate.

All examples and conditional language recited herein are intended far pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention, has been described in detail, it should be understood that the various changes, substitutions, and alterations could be made hereto without departing from the spirit and scope of the invention.

What is claimed is:

1. A variable gain amplifier, comprising:
    a source-grounded transistor, to a gate of which an input signal is supplied;
    a plurality of first cascade transistors, sources of which are connected to a drain of the source-grounded transistor;
    a second cascade transistor, a source of which is connected to the drain of the source-grounded transistor;
    a first gate-grounded transistor, a source of which is connected to drains of the plurality of first cascade transistors, and to a gate of which a constant voltage is applied;
    an output load connected to a drain of the first gate-grounded transistor; and
    a second gate-grounded transistor, a source of which is connected to a drain of the second cascade transistor and to a gate of which the constant voltage is applied;
    wherein the plurality of first cascade transistors and the second cascade transistor are put into a conducting state or a non-conducting state such that a drain current of the source-grounded transistor is constant and moreover a fraction of the drain current supplied to the plurality of first cascode transistors changes.

2. The variable gain amplifier according to claim 1, further comprising a first voltage-compensated load connected to a drain of the second gate-grounded transistor.

3. The variable gain amplifier according to claim 2, further comprising:
    a third cascode transistor, a source of which is connected to the drain of the source-grounded transistor;
    a third gate-grounded transistor, a source of which is connected to a drain of the third cascode transistor, and to a gate of which the constant voltage is applied; and
    a second voltage-compensated load connected to a drain of the third gate-grounded transistor, wherein
        the third cascode transistor is put into a conducting state or a non-conducting state together with the plurality of first cascode transistors and the second cascode transistor such that the drain current of the source-grounded transistor is constant and moreover a fraction of the drain current supplied to the plurality of first cascode transistors changes;
        the channel width of the third gate-grounded transistor is made wider than the channel width of the second gate-grounded transistor; and
        a resistance value of the second voltage-compensated load is made smaller than a resistance value of the first voltage-compensated load.

4. The variable gain amplifier according to claim 3, wherein the resistance value of the first voltage-compensated load and the resistance value of the second voltage-compensated load are inversely proportional to the channel width of the second gate-grounded transistor and the channel width of the third gate-grounded transistor.

5. The variable gain amplifier according to claim 1, wherein the plurality of first cascode transistors and the second cascode transistor are put into a conducting state by applying a constant voltage to the gates thereof.

6. The variable gain amplifier according to claim 1, wherein the source-grounded transistor, the plurality of first cascode transistors, the second cascode transistor, and the first gate-grounded transistors are biased so as to operate in a saturation state.

7. A variable gain amplifier, comprising:
    a source-grounded transistor, to a gate of which an input signal is supplied;
    a plurality of first cascode transistors, to sources of which is supplied a portion of or the entirety of a first drain current of the source-grounded transistor;
    a second cascode transistor, to a source of which is supplied the first drain current excluding a portion supplied to the plurality of first cascode transistors;
    a first gate-grounded transistor, to a source of which is supplied a second drain current of the plurality of first cascode transistors, and to the gate of which a constant voltage is applied;
    an output load, to which a third drain current of the first gate-grounded transistor is supplied; and
    a second gate-grounded transistor, to a source of which a fourth drain current of the second cascode transistor is supplied, and to a gate of which the constant voltage is supplied;
    wherein the plurality of first cascode transistors and the second cascode transistor are put into a conducting state or a non-conducting state such that the first drain current is constant and moreover a fraction of the first drain current supplied to the plurality of first cascode transistors changes.

8. The variable gain amplifier according to claim 7, further comprising a first voltage-compensated load to which a fifth drain current of the second gate-grounded transistor is supplied.

9. The variable gain amplifier according to claim 8, further comprising:
   a third cascode transistor, to a source of which is supplied the first drain current excluding portions supplied to the plurality of first cascode transistors and to the second cascode transistor;
   a third gate-grounded transistor, to a source of which is supplied a sixth drain current of the third cascode transistor, and to a gate of which is supplied the constant voltage; and
   a second voltage-compensated load, to which is supplied a seventh drain current of the third gate-grounded transistor, wherein
      the third cascode transistor is put into a conducting state or a non-conducting state together with the plurality of first cascode transistors and the second cascode transistor such that the first drain current is constant, and moreover a fraction of the first drain current supplied to the plurality of first cascode transistors changes;
      a channel width of the third gate-grounded transistor is made wider than a channel width of the second gate-grounded transistor; and
      the resistance value of the second voltage-compensated load is made smaller than the resistance value of the first voltage-compensated load.

10. The variable gain amplifier according to claim 9, wherein the resistance value of the first voltage-compensated load and the resistance value of the second voltage-compensated load are inversely proportional to the channel width of the second gate-grounded transistor and the channel width of the third gate-grounded transistor.

11. The variable gain amplifier according to claim 7, wherein the plurality of first cascode transistors and the second cascode transistor are put into a conducting state by applying a constant voltage to the gates thereof.

12. The variable gain amplifier according to claim 7, wherein the source-grounded transistor, the plurality of first cascode transistors, the second cascode transistor, and the first gate-grounded transistors are biased so as to operate in a saturation state.

* * * * *